US012587193B2

(12) United States Patent
Rowell

(10) Patent No.: US 12,587,193 B2
(45) Date of Patent: Mar. 24, 2026

(54) PROXIMITY SENSOR WITH INTEGRATED CONTROL FEATURES AND METHOD OF OPERATION THEREOF

(71) Applicant: Eaton Intelligent Power Limited, Dublin (IE)

(72) Inventor: Shane Morse Rowell, Arlington, WA (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 17/778,676

(22) PCT Filed: Nov. 26, 2020

(86) PCT No.: PCT/EP2020/025542
§ 371 (c)(1),
(2) Date: May 20, 2022

(87) PCT Pub. No.: WO2021/104676
PCT Pub. Date: Jun. 3, 2021

(65) Prior Publication Data
US 2022/0376690 A1 Nov. 24, 2022

Related U.S. Application Data

(60) Provisional application No. 62/940,303, filed on Nov. 26, 2019.

(51) Int. Cl.
*H03K 17/945* (2006.01)
(52) U.S. Cl.
CPC ................................. *H03K 17/945* (2013.01)
(58) Field of Classification Search
CPC ...................................................... H03K 17/945
See application file for complete search history.

(56) References Cited

U.S. PATENT DOCUMENTS 4,453,161 A * 6/1984 Lemelson ............. F41A 17/063
340/10.5
8,827,155 B2 * 9/2014 Kocznar ................. E05F 15/76
235/382

(Continued)

FOREIGN PATENT DOCUMENTS

WO 2018/005281 A1 1/2018

OTHER PUBLICATIONS

Thomas Fermentel, European International Searching Authority, International Search Report and Written Opinion, counterpart PCT Application No. PCT/EP2020/025542, mailed Apr. 21, 2021, 12 pages total.

(Continued)

*Primary Examiner* — Menatoallah Youssef
*Assistant Examiner* — Khareem E Almo
(74) *Attorney, Agent, or Firm* — DiBerardino McGovern IP Group LLC

(57) ABSTRACT

A proximity sensor with integrated control features includes a sensing circuit that detects a target feature in proximity thereto and generates a sensor signal responsive to detection of the target feature, an interface circuit that receives inputs from an external device and conditions the inputs to provide digital logic outputs, output electronics that selectively provide actuation signals for driving a load operatively connected to the proximity sensor, and a microcontroller unit in communication with the sensing circuit, the interface circuit, and the output electronics. The microcontroller unit receives sensor signals and digital logic outputs from the sensing circuit and the interface circuit, samples the sensor signals and digital logic outputs, and selectively provides activation signals to the output electronics based on the state of the digital logic outputs and/or the sensor signals, wherein (Continued)

the activation signals cause the output electronics to output the actuation signals to drive the load.

24 Claims, 4 Drawing Sheets

(56) References Cited

U.S. PATENT DOCUMENTS

| | | | | |
|---|---|---|---|---|
| 10,348,183 | B2 * | 7/2019 | Watanabe | H02M 1/32 |
| 2009/0314098 | A1 * | 12/2009 | Ogawa | H03K 17/955 |
| | | | | 73/780 |
| 2017/0334116 | A1 * | 11/2017 | Iwakura | B29C 45/76 |
| 2019/0363311 | A1 * | 11/2019 | Crowley | H02J 7/0024 |
| 2019/0363709 | A1 * | 11/2019 | Bernacchia | H03K 17/56 |

| | | | | |
|---|---|---|---|---|
| 2020/0146440 | A1 * | 5/2020 | Fogarty | A47B 21/02 |
| 2020/0215290 | A1 * | 7/2020 | Bell | B65H 75/4484 |
| 2022/0174801 | A1 * | 6/2022 | Moorthy | H03K 17/962 |
| 2022/0313371 | A1 * | 10/2022 | Morgan | A61B 34/25 |
| 2022/0376690 | A1 * | 11/2022 | Rowell | H03K 17/945 |

OTHER PUBLICATIONS

"Sensor Series: Inductive, capacitive and photoelectric sensors," Eaton Corporation, Publication No. BR053001EN, available at https://www.eaton.com/us/en-us/catalog/machinery-controls/e57-inductive-proximity-sensors.resources.html, Oct. 6, 2019.

H. Li, China National Intellectual Property Administration, Office Action in counterpart CN Patent Application No. 202080086210.0, mailed Aug. 6, 2025, 11 pages total (with English translation).

* cited by examiner

70

72 — RECEIVE EXTERNAL INPUTS & SENSOR SIGNALS AT PROXIMITY SENSOR MCU

74 — PROCESS & ANALYZE INPUTS AND SENSOR SIGNALS

76 — IDENTIFY STATE OF EXTERNAL INPUTS

78 — IDENTIFY STATE OF SENSOR TARGET

80 — NEW TARGET ?

NO — 82

84 — YES

86 — RECORD VALUE OF LAST RECORDED EXTERNAL INPUT STATE

88 — ACTIVATE DIGITAL OUTPUT SIGNALS FROM MCU

90 — PROVIDE ACTUATION SIGNALS TO LOAD

PROXIMITY SENSOR WITH INTEGRATED CONTROL FEATURES AND METHOD OF OPERATION THEREOF

BACKGROUND OF THE INVENTION

Embodiments of the invention relate generally to proximity sensors, and more particularly, to proximity sensors having timing and control logic features integrated therein.

Proximity sensors are used to detect the position of one part in relation to another part without making physical contact. For example, use may be made of electromagnetic sensors in the form of inductive or capacitive proximity sensors that respond to metal members near the detection element of the sensor.

One common application for proximity sensors is the use thereof in high-speed sorting conveyance applications. One or more proximity sensors may be positioned along a conveyor line for detecting the presence of items or line features passing nearby. The detection of an item or line feature by the proximity sensor(s) activates associated equipment that performs a sorting operation.

Typically, in high-speed sorting conveyance applications as described above or in other applications in which proximity sensors may be used, external devices such as programmable logic controllers (PLCs) or timing modules are required in combination with the proximity sensor in order to provide processing and control functions and provide for activation of associated equipment, such as an external actuator (e.g., rotary solenoid, DC motor, etc.). It is recognized, however, that external devices such as PLCs, timing modules, and the like may add significant cost to the system in which the proximity sensor is utilized.

Therefore, it would be desirable to provide an integrated proximity sensor that includes the timing and control logic required for supporting a desired application, such as a high-speed sortation application. The integrated sensing device would contain all of the necessary electronics for detecting the presence of a line feature or target, processing input signals, and generating desired outputs, such as control signals for operation of an H-bridge for driving an associated external actuator.

BRIEF DESCRIPTION OF THE INVENTION

In accordance with one aspect of the invention, a proximity sensor with integrated control features is provided. The proximity sensor includes a sensing circuit configured to detect a presence of a target feature in proximity thereto, the sensing circuit generating a sensor signal responsive to detection of the target feature. The proximity sensor also includes an interface circuit operable to receive inputs from an external device and condition the inputs to provide digital logic outputs, output electronics configured to selectively provide actuation signals for driving a load operatively connected to the proximity sensor, and a microcontroller unit in communication with each of the sensing circuit, the interface circuit, and the output electronics. The microcontroller unit is programmed to receive sensor signals and digital logic outputs from the sensing circuit and the interface circuit, respectively, sample the sensor signals and digital logic outputs, and selectively provide activation signals to the output electronics based on the state of the digital logic outputs and/or based on the sensor signals, wherein the activation signals cause the output electronics to output the actuation signals to the load to drive the load responsive thereto.

In accordance with another aspect of the invention, a method for driving a load via a proximity sensor with integrated control features includes receiving at the integrated proximity sensor inputs from an external logic device, the inputs having a state associated therewith identified by the integrated proximity sensor, detecting via the integrated proximity sensor, a presence of a target feature in proximity to the integrated proximity sensor and, upon identification of a change in state of the inputs from the external logic device and a subsequent detection of the target feature, outputting actuation signals from the integrated proximity sensor to a load to control operation thereof, wherein the actuation signals are generated from output electronics included in the integrated proximity sensor.

In accordance with yet another aspect of the invention, a system includes an electrically actuated load, a proximity sensor with integrated control features that is operably connected to the load to selectively provide actuation signals thereto to drive the electrically actuated load, and a logic device in operable communication with the proximity sensor to provide input signals thereto. The proximity sensor further includes a sensing circuit configured to detect a presence of a target feature in proximity thereto and generate a sensor signal responsive to detection of the target feature, an interface circuit operable to receive the inputs from the logic device and condition the inputs to provide digital logic outputs, output electronics configured to selectively provide the actuation signals to the load, and a microcontroller unit in communication with each of the sensing circuit, the interface circuit, and the output electronics. The microcontroller unit is programmed to receive sensor signals and digital logic outputs from the sensing circuit and the interface circuit, sample the sensor signals and digital logic outputs, and selectively provide activation signals to the output electronics based on the sensor signals and/or based on the state of the digital logic outputs, the activation signals causing the output electronics to output the actuation signals to the electrically actuated load to drive the electrically actuated load responsive thereto.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENT

Embodiments of the invention are directed to a proximity sensor that includes timing and control logic features integrated therein. The integrated proximity sensor includes all of the necessary electronics for detecting the presence of a line feature or target, processing input signals, and generating desired outputs, such as control signals for operating an associated external device or load.

The operating environment of the invention is described below with respect to a high-speed sorting system that utilizes proximity sensor(s) having integrated timing and control logic features, according to the invention. However, while the invention will be described with respect to such a high-speed sorting system, embodiments of the invention are equally applicable for other suitable applications where a proximity sensor having integrated timing and control logic features might be utilized. Accordingly, it is to be understood that embodiments of the invention should not be limited by the particular application/use described here below.

Figure 1:
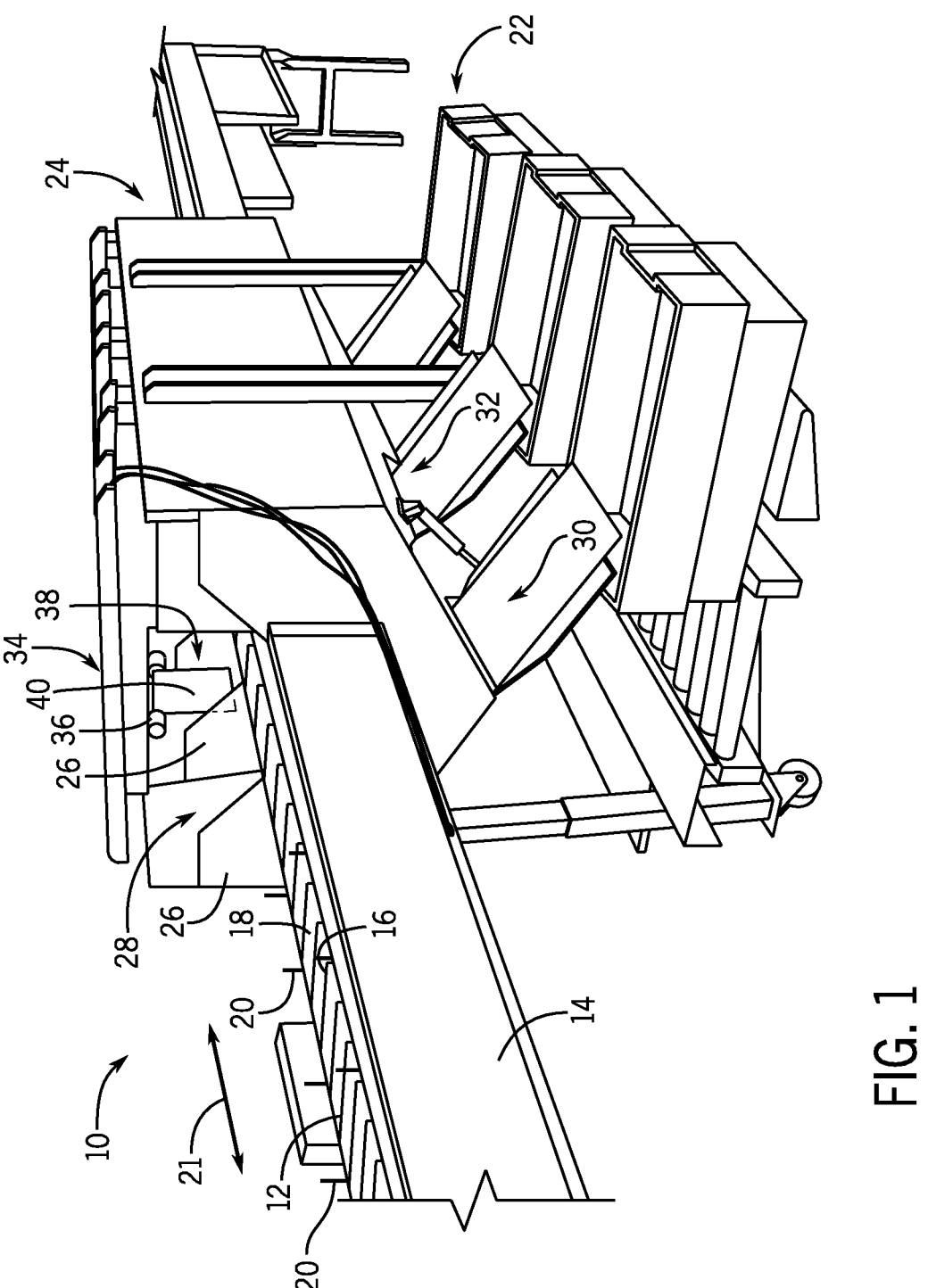
FIG. 1 is a perspective view of a conveyor sorter system in which an integrated proximity sensor may be implemented, according to an embodiment of the invention.

Referring now to FIG. 1, a conveyor sorting system 10 is shown with which embodiments of the invention may be implemented. The conveyor sorting system 10 enables the quick and efficient sorting of items from a conveyor to a desired location, such as a bin, storage tote, or downstream conveyor. The system 10 comprises a conveyor 12, such as a continuous conveyor belt defining a pair of opposing sides, that is supported by rails 14 so that the conveyor travels along a predetermined path. The conveyor 12 is operable to transport or direct articles of various shapes and sizes along a path of travel defined by the conveyor 12. The conveyor 12 may be a plastic, rubberized, or coated belt that provides sufficient friction with articles placed thereon, and can include a plurality of raised portion or cleats 16 that are defined by the outer surface 18 of the conveyor 12 and that function to support large or thin articles, so that the articles can be more easily removed. According to an exemplary embodiment, conveyor 12 further includes target features 20, such as metallic pins, positioned at intermittent locations along the conveyor 12 in the machine direction 21, with the target features 20 positioned along one or more of the opposing sides of the conveyor 12 and serving as a "sort" indicator, as will be explained in greater detail below.

The system 10 also includes a sorting area 22 positioned along the conveyor 12 such that the sorting area 22 at least partially surrounds the conveyor 12. The sorting area 22 may be defined by an outer housing 24 within which are positioned a plurality of dividers 26 that are disposed at spaced intervals along the predetermined path of the conveyor 12 and that define a plurality of bins or chutes 28 adjacent the conveyor 12. According to one embodiment, the chutes 28 are divided into opposing pairs of chutes comprising a first chute 30 and a second chute 32 that define inlets defined by the dividers 26, such that articles being directed from the conveyor 12 fall into either the first chute 30 or second chute 32.

The sorting area 22 also includes one or more sorting devices 34 that are preferably attached to the housing 24 and positioned above the conveyor 12 such that the number of sorting devices 34 corresponds to the number of pairs of opposing chutes 28 spaced along the predetermined path. In particular, each sorting device 34 includes a drive source 36 that is operably connected to a diverter 38 to move or rotate the diverter 38 relative to the conveyor 12, so as to divert articles off from either side of the conveyor 12 to provide sorting thereof. According to embodiments, the drive source 36 can be a pneumatic, hydraulic, mechanical, electrical, or other type of drive source known in the art, although in an exemplary embodiment the drive source 36 is a rotary solenoid or brushed DC motor. Regarding diverter 38, the diverter 38 may be configured as a single paddle or flipper 40 that is operably connected to the drive source 36 so as to be selectively positionable relative to the conveyor 12. In such an embodiment, the diverter flipper 38 is preferably formed of a rigid or semi-rigid material, such as plastic or metal, such that the diverter 38 is capable of directing articles from the conveyor 12 into the chutes 28. The diverter 38 is utilized for engaging the articles and sweeping or directing the articles into the first chute 30 and the second chute 32, respectively, to sort articles from either side of the conveyor 12.

Figure 2:
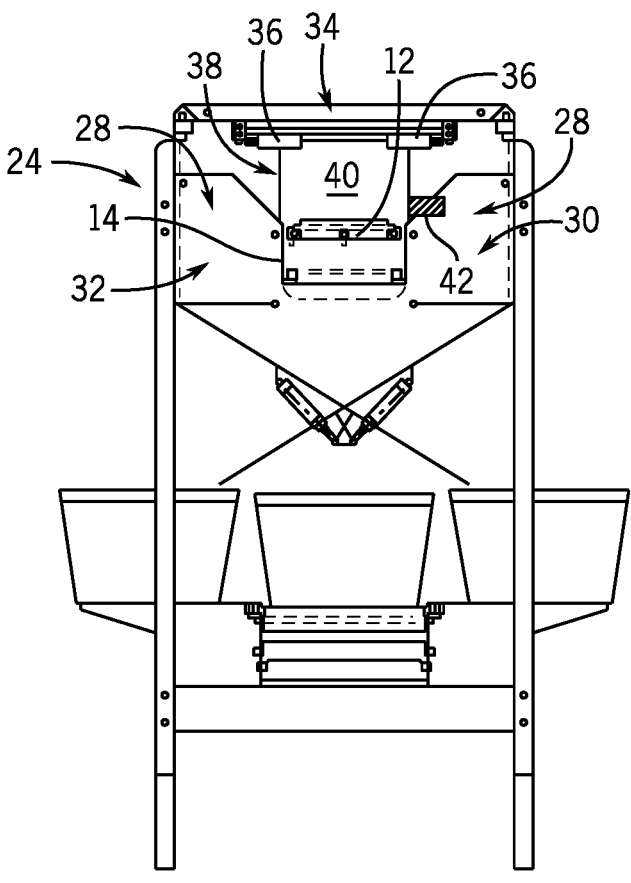
FIG. 2 is an end elevational view of the conveyor sorter system of FIG. 1.

The system 10 also includes a proximity sensor 42 (FIG. 2) that is operably connected to the sorting device 34 and that functions to detect the presence of an article or the presence of target features 20 and generates an appropriate signal to control the drive source 36 and thus the diverter 38. For example, in an embodiment where drive source 36 is a rotary solenoid, signals generated by proximity sensor 42 may energize the solenoid and de-energize the solenoid by removing power to the solenoid. The solenoid 36, in turn, moves/rotates the diverter 38 relative to the conveyor 12, with actuation of the diverter 38 sorting/diverting objects translating along the conveyor 12 into a desired chute 28 or location. In an exemplary embodiment, the rotary solenoid 36 is a bi-stable device that may be energized with a positive polarity to move (rotate) to one position and then de-energized, and that may be energized with a negative polarity to move (rotate) to the other position and then de-energized. In another embodiment where the rotary solenoid is not a bi-stable device, but rather a device with a spring return for example, power would need to be applied whenever it was desired to be in the active (energized) state.

Figure 3:
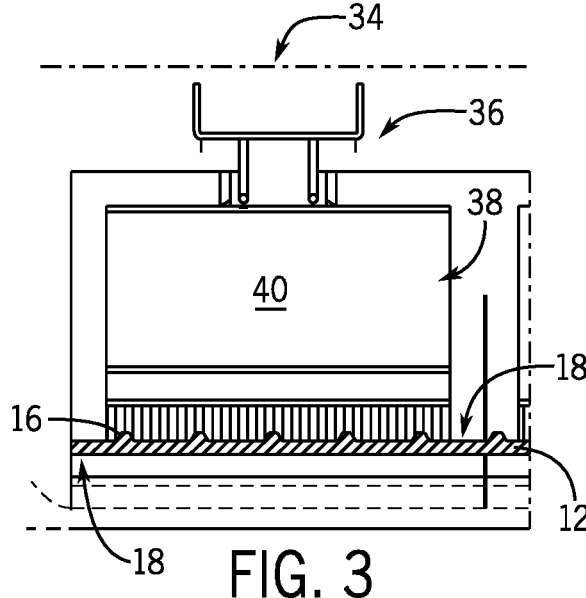
FIG. 3 is a detailed view of a sorting device included in the conveyor sorter system of FIG. 1.
Figure 4:
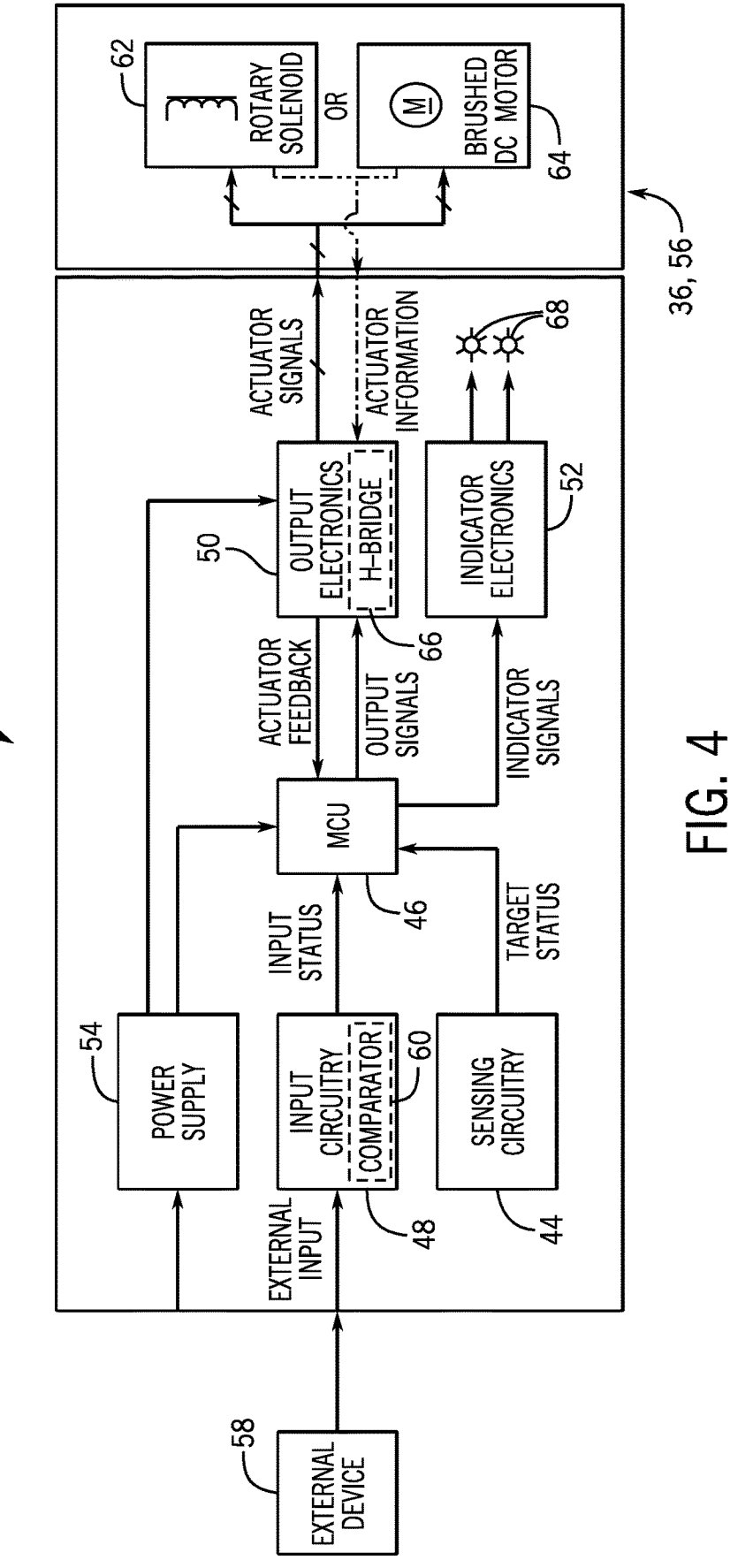
FIG. 4 is a schematic block diagram of an integrated proximity sensor for operating a load, according to an embodiment of the invention.

Referring now to FIG. 4, a more detailed view of proximity sensor 42 is shown to enable a further description of the construction and functionality thereof. The proximity sensor 42 is provided as a proximity sensor that includes timing and control logic integrated therein (hereinafter "integrated proximity sensor") that is required for supporting a high-speed sortation system, such as the conveyor sorting system 10 illustrated in FIGS. 1-3. The integrated proximity sensor 42 contains all of the necessary electronics for detecting the presence of metallic targets, processing input signals, and generating outputs appropriate for actuation of a drive source 36, which may comprise a rotary solenoid or brushed DC motor device. As shown in FIG. 4, integrated proximity sensor 42 may thus be generally comprised of a sensing circuit 44, a microcontroller unit (MCU) 46, an interface circuit 48, output electronics 50, indicator electronics 52, and power supply circuitry 54.

The MCU 46 of proximity sensor 42 may be of a known architecture and type, such as a single metal-oxide-semiconductor (MOS) integrated circuit chip, for example. The MCU 46 provides a self-contained system within integrated proximity sensor 42 with a processor, memory, and peripherals (not shown) that can be used to provide communication with and control of multiple input and output devices, including sensing circuit 44, interface circuit 48, output electronics 50, and indicator electronics 52. According to an embodiment, the MCU 46 may also contain appropriate configuration information that may be specific to a particular load 56 driven thereby. For example, the MCU 46 may contain configuration information regarding a duration for which actuation current is to be provided to the load 56. The MCU 46 is powered via the power supply circuitry 54 included in the integrated proximity sensor 42—with the power supply circuitry 54, according to one embodiment, operating to convert an input power received from an external source (not shown) to a voltage level required by the MCU 46 (and providing power to output electronics 50).

According to an exemplary embodiment, the sensing circuit 44 of integrated proximity sensor 42 is in the form of an electromagnetic detection element, such as an inductive or capacitive detection element, that responds to metal members (e.g., a target feature 20) near its sensing face. The sensing circuit 44 thus functions to detect the presence of a target feature 20 and, responsive to such sensing, generates a sensor signal indicative of a target status, with the signal being provided as an input to MCU 46.

The interface circuit 48 of integrated proximity sensor 42 may be circuitry of any type suitable for receiving and reading the status of a signal provided thereto from an external device 58, such as a programmable logic controller (PLC) or logic device in communication with the integrated proximity sensor 42. According to one embodiment, the external PLC/logic device 58 may operate to provide control over a system with which the integrated proximity sensor 42 is utilized, such as a high-speed sortation system 10 (FIG. 1), for example. The PLC/logic device 58 may provide for automated control (power and/or communication) of devices/components of such a system and also provide input signals to the integrated proximity sensor 42—with the input signals provided to integrated proximity sensor 42 being analog voltage or timing signals, according to one embodiment. The interface circuit 48 may include analog comparator circuitry 60 that takes the output from the PLC 58 and compares it against discrete thresholds to determine if the voltage of the input signals is less then or greater than the given threshold, with the comparator circuitry 60 having some hysteresis to reduce the effect of noise on the input signal. The comparator circuitry 60 generates digital logic level outputs for transfer to MCU 46, with the digital logic level outputs being compatible with the MCU input.

According to an exemplary embodiment, the output electronics 50 of integrated proximity sensor 42 are configured to enable selective actuation and operation of a connected load 56. That is, output electronics 50 include the necessary components required to actuate a load 56, such as the rotary solenoid 62 or brushed DC motor 64 shown in FIG. 4, for example. The output electronics 50 may thus comprise, for example, an H-bridge (generally indicated at 66) that functions to switch the polarity of a voltage applied to the rotary solenoid 62 or brushed DC motor 64, so as to allow the solenoid/motor to run forwards or backwards. The H-bridge 66 may include switches (not shown) of a type suitable for low power actuator control, including electromechanical switches (e.g., relays) or sold-state switches such as bipolar junction transistors (BJTs), field effect transistors (FETs), or integrated gate bipolar transistors (IGBTs), for example. In addition to the output electronics 50 including the electronics necessary to actuate the load 56 (rotary solenoid 62 or brushed DC motor 64), the output electronics 50 may contain additional circuitry configured to monitor the current delivered to the load 56 and/or protect against load fault conditions, such as overload conditions and short circuit conditions (shorted load). Still further, the output electronics 50 may be configured to receive feedback from the load 56 (rotary solenoid 62 or brushed DC motor 64) as to the position and/or the speed thereof, and to process said feedback in order to provide for more controlled operation of the load 56.

In operation of integrated proximity sensor 42, input signals are provided to the MCU 46 from sensing circuit 44 and/or interface circuit 48, with such input signals comprising input signals from the sensing circuit 44 indicating the status of the target feature 20 and comprising digital logic level outputs from the interface circuit 48 derived from external signals from external device 58, such as a PLC. The MCU 46 continuously monitors (at predetermined intervals) for digital logic level outputs from the interface circuit 48 and performs a digital low pass filtering algorithm that requires a consecutive number of samples of the digital logic level outputs to determine it is at a given state (high or low). The MCU 46 also monitors the output of the sensing circuit 44 at predetermined intervals and performs a digital low pass filtering algorithm that requires a consecutive number (not required to be the same consecutive number as the digital logic level outputs) of logic level input samples from the sensing circuit 44. When the MCU 46 has determined that the sensor state has changed from one state to another, the value of the last recorded input state (from external device 58 via interface circuit 48) is latched into memory of the MCU 46. If this input state is determined to have changed, a change event is determined and, when this change event has been determined, the MCU 46 activates its digital output signals that interface to the output electronics 50 for a predetermined time. That is, the MCU 46 contains appropriate configuration information that may be specific to the particular load 56, such as the duration for which actuation current is provided to the load. The digital output signals from MCU 46 are provided to output electronics 50, with the output electronics 50 conditioning the output signals in order to selectively control/actuate the load 56 (rotary solenoid 62 or DC motor 64) operably connected to the integrated proximity sensor 42—such as by controlling the polarity of a voltage applied to the load 56.

In addition to generating digital output signals to output electronics 50, the MCU 46 may also output indicator signals to the indicator electronics 52 that cause the indicator electronics 52 to indicate the status of the integrated proximity sensor 42. As an example, indicator signals may control the illumination of LED indicators 68 included in the indicator electronics 52 to indicate the status of the integrated proximity sensor 42 and/or the operational status of the load 56.

Figure 5:
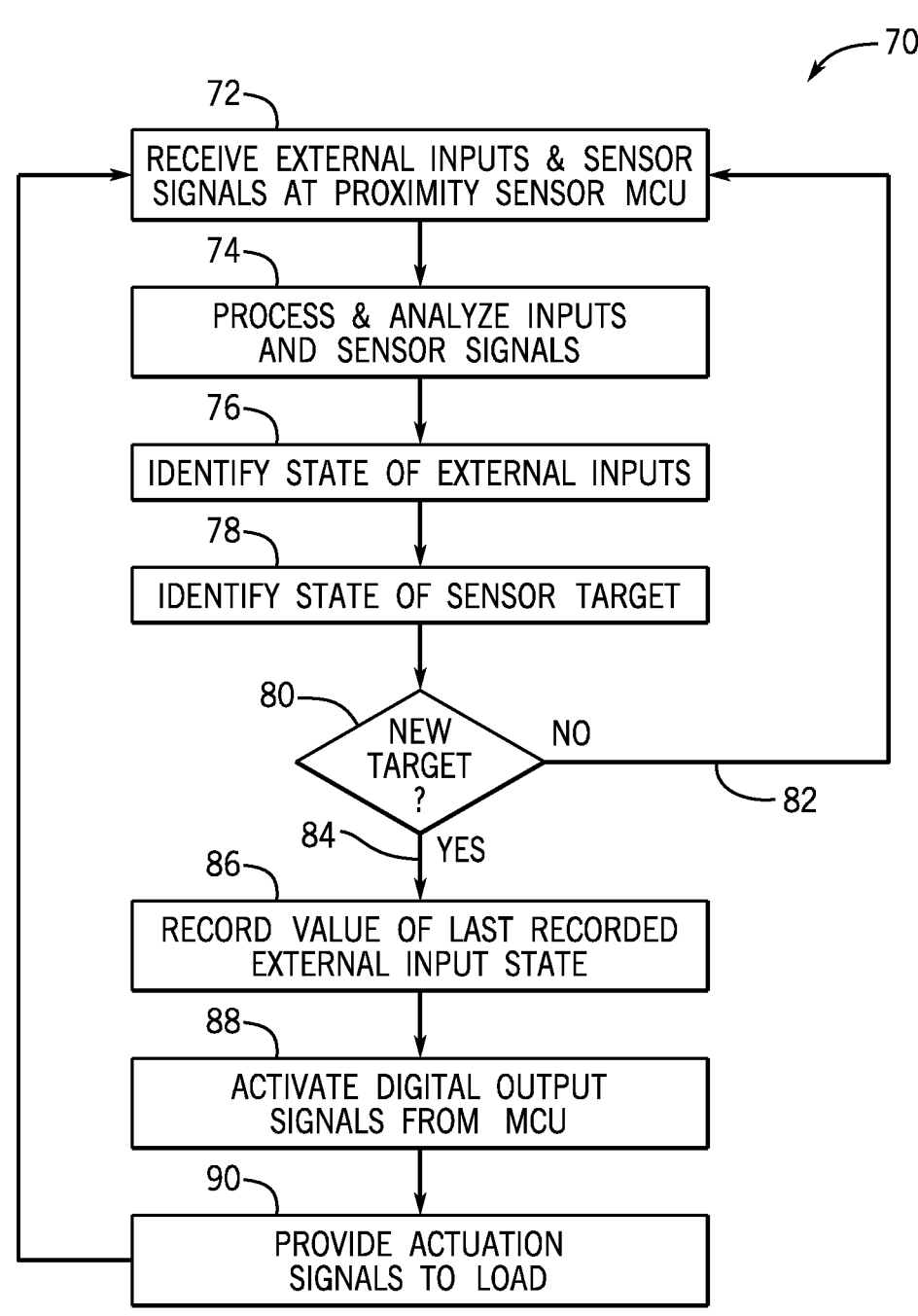
FIG. 5 is a flowchart illustrating a method for operating a load via an integrated proximity sensor, according to an embodiment of the invention.

Referring now to FIG. 5, and with continued reference back to FIGS. 1-4, a flowchart is provided illustrating a method 70 for operating a load via an integrated proximity sensor, such as the integrated proximity sensor 42. While the method 70 is described here below in the context of controlling operation of a rotary solenoid or DC motor that is provided as part of a sortation control system, it is recognized that a similar method could be used in other applications, including driving different loads and controlling the load based on a different number of required input state changes in order to cause the output to change, for example.

As shown in FIG. 5, the method 70 begins at STEP 72 with the MCU 46 receiving input signals from an external source 58 (via signal interface circuit 48) and sensor signals from sensing circuit 44. In the present embodiment, the input signals to the MCU 46 are from a PLC or similar logic device, where signals from the PLC 58 (e.g., analog voltage or timing signals) are read/processed by comparator circuitry 60 of the interface circuit 48 and compared against discrete thresholds to determine a state of the input signal relative to the threshold, with the comparator circuitry 60 then generating compatible digital logic level outputs for transfer to the MCU 46 indicative of the signal state. The sensor signals are provided from sensing circuit 44 to the MCU 46 based on a response of the sensing circuit 44 to a metallic target feature 20 that is a position indicator on a conveyor sorting system 10. As indicated previously, the metallic target feature 20 may be in the form of a "pin" on the conveyor 12 of conveyor sorting system 10. The MCU 46 continuously monitors (at predetermined intervals) for digital logic level outputs from the interface circuit 48 and for outputs of the sensing circuit 44, so as to acquire a plurality of such signals over time.

Upon receiving input signals from the PLC 58 (i.e., digital logic level output signals from comparator circuitry 60 in interface circuit 48) and sensor signals from sensing circuit 44, the MCU 46 proceeds to process and analyze these signals at STEP 74. In processing/analyzing the signals, the MCU 46 performs a digital low pass filtering algorithm on each of the signals. In performing the digital low pass filtering algorithm, it is recognized that at least a minimum consecutive number of the digital logic level output signals should be received from the interface circuit 48 and that at least a minimum consecutive number of sensor signals should be received from the sensing circuit 44 (which may be different than the number of digital logic level output signals). In performing the digital low pass filtering algorithm, the MCU 46 monitors the digital logic level output signals provided by the comparator circuitry 60 to determine a state or status thereof—i.e., a high state or low state, for example—as indicated at STEP 76, with it recognized that the state of the digital logic level output signals is reflective/indicative of a corresponding state of the input signals from the external source 58. In performing the digital low pass filtering algorithm, the MCU 46 also monitors the sensor signals received from the sensing circuit 44 to identify a state of the sensor target (i.e., identify detection of a target feature 20), as indicated at STEP 78.

A determination is then made at STEP 80 as to whether a next/new target feature 20 has been sensed—based on the sensor signals received at MCU 46 from the sensing circuit 44. If it is determined at STEP 80 that no new target feature 20 has been sensed, as indicated at 82, then the method proceeds by looping back to STEPS 72-76, where digital logic level output signals and sensor signals continue to be received and monitored. Alternatively, if it is determined at STEP 80 that a new target feature 20 has been sensed, as indicated at 84, then the method proceeds to STEPS 86 and 88—where a value of the last recorded input state of the digital logic level output signals is latched into memory of the MCU 46 (STEP 86) and the MCU 46 activates its digital output signals that interface to the output electronics 50 for a predetermined time (STEP 88).

As shown in FIG. 5, the method 70 then continues at STEP 90 with actuation signals being provided from the output electronics 50 to the load 56—i.e., the rotary solenoid 62 or DC motor 64—so as to cause the solenoid or motor to change state or position in a desired manner, such as rotating in a first direction or a second direction. In an exemplary embodiment, the electrical polarity of a voltage applied to the rotary solenoid 62 or DC motor 64 in the actuation signals may be changed (positive or negative) in order to cause rotation thereof in a desired direction. The rotation of the rotary solenoid 62 or DC motor 64 causes a corresponding rotation of a diverter 38 that directs articles from a conveyor 12 into designated chutes 28. The diverter 38 is utilized for engaging articles and sweeping or directing the articles into a first chute 30 or a second chute 32, for example, based on the orientation thereof, to sort articles from either side of the conveyor 12

Upon causing the rotary solenoid 62 or DC motor 64 to change state or position in a desired manner, the method 70 continues by looping back to STEP 72 to further monitor input signals from the PLC 58 and sensor signals from sensing circuit 44 and process and analyze those signals, as previously described. When a next determination is made that the PLC signal is taken back to the opposite state once again, on the next detection of a new target feature 20 at STEP 80, the digital output signals from the MCU 46 to the output electronics 50 will be activated/energized for the predetermined time once again, so as to cause the rotary solenoid 62 or DC motor 64 to revert to the previous position.

Thus, as described above, the method 70 is able to identify a change event and—responsive to such a change event—activate digital output signals that interface to the output electronics 50 for a predetermined time, so as to cause desired actuation of a load connected thereto.

Beneficially, embodiments of the invention provide a proximity sensor having that includes the timing and control logic required for supporting a desired application—such as a high-speed sortation application—integrated therein. The integrated proximity contains all of the necessary electronics for detecting the presence of a target feature, processing input signals, and generating desired outputs, such as control signals for operating an associated external actuator. The integrated proximity sensor continuously samples input signals received from an external logic device and is able to eliminate erroneous responses due to short duration noise events that could be incorrectly detected as the change of state of an input.

Therefore, according to one embodiment of the invention, a proximity sensor with integrated control features is provided. The proximity sensor includes a sensing circuit configured to detect a presence of a target feature in proximity thereto, the sensing circuit generating a sensor signal responsive to detection of the target feature. The proximity sensor also includes an interface circuit operable to receive inputs from an external device and condition the inputs to provide digital logic outputs, output electronics configured to selectively provide actuation signals for driving a load operatively connected to the proximity sensor, and a microcontroller unit in communication with each of the sensing circuit, the interface circuit, and the output electronics. The microcontroller unit is programmed to receive sensor signals and digital logic outputs from the sensing circuit and the interface circuit, respectively, sample the sensor signals and digital logic outputs, and selectively provide activation signals to the output electronics based on the state of the digital logic outputs and/or based on the sensor signals, wherein the activation signals cause the output electronics to output the actuation signals to the load to drive the load responsive thereto.

According to another embodiment of the invention, a method for driving a load via a proximity sensor with integrated control features includes receiving at the integrated proximity sensor inputs from an external logic device, the inputs having a state associated therewith identified by the integrated proximity sensor, detecting via the integrated proximity sensor, a presence of a target feature in proximity to the integrated proximity sensor and, upon identification of a change in state of the inputs from the external logic device and a subsequent detection of the target feature, outputting actuation signals from the integrated proximity sensor to a load to control operation thereof, wherein the actuation signals are generated from output electronics included in the integrated proximity sensor.

According to yet another embodiment of the invention, a system includes an electrically actuated load, a proximity sensor with integrated control features that is operably connected to the load to selectively provide actuation signals thereto to drive the electrically actuated load, and a logic device in operable communication with the proximity sensor to provide input signals thereto. The proximity sensor further includes a sensing circuit configured to detect a presence of a target feature in proximity thereto and generate a sensor signal responsive to detection of the target feature, an interface circuit operable to receive the inputs from the logic device and condition the inputs to provide digital logic outputs, output electronics configured to selectively provide the actuation signals to the load, and a microcontroller unit in communication with each of the sensing circuit, the interface circuit, and the output electronics. The microcontroller unit is programmed to receive sensor signals and digital logic outputs from the sensing circuit and the interface circuit, sample the sensor signals and digital logic outputs, and selectively provide activation signals to the output electronics based on the sensor signals and/or based on the state of the digital logic outputs, the activation signals causing the output electronics to output the actuation signals to the electrically actuated load to drive the electrically actuated load responsive thereto.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A proximity sensor comprising:
a sensing circuit configured to detect a presence of a target feature comprising a physical object, the sensing circuit generating a sensor signal responsive to detection of the target feature comprising the physical object in proximity to the sensing circuit;
an interface circuit operable to receive inputs from an external device and condition the inputs to provide digital logic outputs;
output electronics configured to selectively provide actuation signals for driving a load operatively connected to the proximity sensor; and
a microcontroller unit in communication with each of the sensing circuit, the interface circuit, and the output electronics, the microcontroller unit programmed to:
receive sensor signals and digital logic outputs from the sensing circuit and the interface circuit, respectively;
identify a state of the inputs received at the interface circuit from the external device based on the digital logic outputs, wherein the identified state is any one of a plurality of possible states of the inputs;
monitor the sensor signal to determine if a target feature comprising a physical object is detected in proximity to the sensing circuit;
determine if the identified state of the inputs received at the interface circuit from the external device has changed relative to a previous state of the inputs received at the interface circuit from the external device; and
if the target feature comprising the physical object is detected in proximity to the sensing circuit and if the identified state of the inputs received at the interface circuit from the external device has changed relative to a previous state of the inputs received at the interface circuit from the external device, store the identified state of the inputs and provide activation signals to the output electronics; wherein the activation signals cause the output electronics to output the actuation signals to the load to drive the load, and the load comprises one of a rotary solenoid or a brushed DC motor, and wherein the microcontroller unit is further configured to:
receive feedback from the rotary solenoid or brushed DC motor; and
determine one or more of a position and a speed of the rotary solenoid or brushed DC motor based on the feedback.

2. The proximity sensor of claim 1 wherein the interface circuit comprises comparator circuitry configured to read the inputs from the external device and provide the digital logic outputs.

3. The proximity sensor of claim 2 wherein the external device comprises an external logic device that provides analog voltage signals to the proximity sensor, and wherein the comparator circuitry is configured to:
compare a voltage of the inputs from the external device to a voltage threshold;
characterize a state of the inputs as high voltage or low voltage signals based on the comparison to the voltage threshold; and
wherein the digital logic outputs indicate the state of the inputs.

4. The proximity sensor of claim 1 wherein the output electronics comprise an H-bridge circuit configured to control an electrical polarity of a voltage applied to the load in the actuation signals provided thereto, the output electronics controlling the electrical polarity based on the activation signals provided from the microcontroller unit.

5. The proximity sensor of claim 1 further comprising indicator electronics in communication with the microcontroller unit and configured to indicate a status of the proximity sensor and/or an operational status of the load responsive to indicator signals received from the microcontroller unit.

6. The proximity sensor of claim 1 further comprising power supply circuitry configured to convert an input power received from an external source and provide a suitable output power to the microcontroller unit to provide for operation of the microcontroller unit.

7. The proximity sensor of claim 1 wherein the output electronics are configured to monitor current provided to the load and/or protect against load fault conditions.

8. A method for driving a load via a proximity sensor with integrated control features, the method comprising:
receiving, at the proximity sensor, inputs from an external logic device, the inputs having a state associated therewith identified by the proximity sensor;
detecting, via the proximity sensor, a presence of a target feature in proximity to the proximity sensor, the target feature comprising a physical object;
upon identification of a change in state of the inputs from the external logic device from one state to any other state and a subsequent detection of the target feature in proximity to the proximity sensor, determining that a change event has occurred and outputting actuation signals from the proximity sensor to a load to control operation thereof, wherein the load comprises one of a rotary solenoid and a brushed DC motor; outputting actuation signals from the proximity sensor comprises controlling an electrical polarity of a voltage applied to the load in the actuation signals, so as to apply a voltage having a positive electrical polarity or a negative electrical polarity; and a direction of rotation of the load is controlled via the electrical polarity of the voltage applied thereto;

receiving feedback from the load; and determining one or more of a position and a speed of the load based on the feedback; wherein the actuation signals are generated from output electronics included in the proximity sensor.

9. The method of claim 8 further comprising identifying the state of the inputs via comparator circuitry and a microcontroller unit of the proximity sensor, wherein identifying the state of the inputs comprises:

comparing, via the comparator circuitry, a voltage of the inputs from the external logic device to a voltage threshold;

characterizing, via the comparator circuitry, the state of the inputs as high voltage or low voltage signals based on the comparison to the voltage threshold; and causing the comparator circuitry to output digital logic outputs to the microcontroller unit indicating the state of the inputs; and sampling the digital logic outputs at the microcontroller unit to identify the state of the inputs from the external logic device.

10. The method of claim 8 further comprising controlling switching in an H-bridge circuit of the output electronics to control the electrical polarity of a voltage applied to the load.

11. The method of claim 8 further comprising indicating a status of the proximity sensor and/or an operational status of the load via indicator electronics incorporated in the proximity sensor.

12. A system comprising:

an electrically actuated load;

a proximity sensor with integrated control features, the proximity sensor operably connected to the load to selectively provide actuation signals thereto to drive the electrically actuated load; and a logic device external to the proximity sensor and in operable communication with the proximity sensor to provide inputs thereto;

wherein the proximity sensor comprises:

a sensing circuit configured to detect a presence of a target feature in proximity thereto, the target feature comprising a physical object and the sensing circuit generating a sensor signal responsive to detection of the target feature in proximity to the sensing circuit;

an interface circuit operable to receive the inputs from the logic device and condition the inputs to provide digital logic outputs;

output electronics configured to selectively provide the actuation signals to the load; and a microcontroller unit in communication with each of the sensing circuit, the interface circuit, and the output electronics, the microcontroller unit programmed to:

receive sensor signals and digital logic outputs from the sensing circuit and the interface circuit, respectively;

identify a state of the inputs, wherein the identified state is any one of a plurality of possible states of the inputs;

monitor the sensor signal to determine if a target feature is detected in proximity to the sensing circuit, the target feature comprising a physical object; and if the target feature is detected in proximity to the sensing circuit and if the identified state of the inputs has changed relative to a previous state of the inputs, store the identified state of the inputs and provide activation signals to the output electronics, the activation signals causing the output electronics to output the actuation signals to the electrically actuated load to drive the electrically actuated load responsive thereto.

13. The system of claim 12 wherein the interface circuit comprises comparator circuitry configured to read the inputs from the external device and provide the digital logic outputs, the comparator circuitry configured to:

compare a voltage of the inputs from the external device to a voltage threshold;

characterize a state of the inputs as high voltage or low voltage signals based on the comparison to the voltage threshold; and wherein the digital logic outputs indicate the state of the inputs.

14. The system of claim 12 wherein the microcontroller unit is configured to:

identify the state of the inputs from the logic device based on the digital logic outputs from the interface circuit;

identify a change in state of the inputs;

monitor the sensor signal from the sensing circuit to determine detection of the target feature; and if the change in state is identified and the target feature is detected, provide the activation signals to the output electronics.

15. The system of claim 12 wherein the electrically actuated load comprises a DC motor or a rotary solenoid; and wherein the output electronics are configured to control an electrical polarity of a voltage applied to the DC motor or the rotary solenoid in the actuation signals provided thereto, the output electronics controlling the electrical polarity based on the activation signals provided from the microcontroller unit.

16. The proximity sensor of claim 1, wherein if the target feature is detected, store the identified state of the inputs and provide activation signals to the output electronics for a pre-determined amount of time.

17. A proximity sensor comprising:

an interface circuit configured to output a digital logic output based on an input from programmable logic controller;

a sensing circuit configured to detect a target feature and to generate a sensor signal in response to detecting the target feature, the target feature comprising a physical object;

output electronics configured to drive a load; and a microcontroller configured to:

determine if a state of the input from the programable logic controller has changed from a first possible state to any other possible state;

determine if the target feature has been detected in proximity to the sensing circuit; and if the state of the input from the programable logic controller has changed and if the target feature has been detected in proximity to the sensing circuit, store the state of the input and provide an activation signal to the load for a predetermined amount of time.

18. A proximity sensor comprising:

a sensing circuit configured to detect a presence of a target feature in proximity thereto, the sensing circuit generating a sensor signal responsive to detection of the target feature;

an interface circuit operable to receive inputs from an external device and condition the inputs to provide digital logic outputs;

output electronics configured to selectively provide actuation signals for driving a load operatively connected to the proximity sensor; and a microcontroller unit in communication with each of the sensing circuit, the interface circuit, and the output electronics, the microcontroller unit programmed to:

receive sensor signals and digital logic outputs from the sensing circuit and the interface circuit, respectively;

identify a state of the inputs from the external device based on the digital logic outputs, wherein the identified state is any one of a plurality of possible states of the inputs;

monitor the sensor signal to determine if a target feature is detected; and if the target feature is detected, store the identified state of the inputs and provide activation signals to the output electronics; wherein the activation signals cause the output electronics to output the actuation signals to the load to drive the load responsive thereto, wherein the output electronics comprise an H-bridge circuit configured to control an electrical polarity of a voltage applied to the load in the actuation signals provided thereto, the output electronics controlling the electrical polarity based on the activation signals provided from the microcontroller unit.

19. The proximity sensor of claim 17 wherein the output electronics comprise an H-bridge circuit configured to control an electrical polarity of a voltage applied to the load based on the activation signals provided from the microcontroller.

20. The proximity sensor of claim 17 further comprising indicator electronics in communication with the microcontroller and configured to indicate a status of the proximity sensor and/or an operational status of the load responsive to indicator signals received from the microcontroller.

21. A method for driving a load via a proximity sensor with integrated control features, the method comprising:

receiving, at the proximity sensor, inputs from an external logic device, the inputs having a state associated therewith identified by the proximity sensor;

detecting, via the proximity sensor, a presence of a target feature in proximity to the proximity sensor, the target feature comprising a physical object;

upon identification of a change in state of the inputs from the external logic device from one state to any other state and a subsequent detection of the target feature in proximity to the proximity sensor, determining that a change event has occurred and outputting actuation signals from the proximity sensor to a load to control operation thereof, wherein the actuation signals are generated from output electronics included in the proximity sensor, and outputting actuation signals from the proximity sensor comprises controlling an electrical polarity of a voltage applied to the load in the actuation signals to apply a voltage having a positive electrical polarity or a negative electrical polarity; and controlling switching in an H-bridge circuit of the output electronics to control the electricidal polarity of a voltage applied to the load in the actuation signals provided thereto; receiving feedback from the load; and determining one or more of a position and a speed of the load based on the feedback.

22. The proximity sensor of claim 18 wherein the load comprises one of a rotary solenoid or a brushed DC motor, and wherein the microcontroller unit is further configured to:

receive feedback from the rotary solenoid or brushed DC motor; and determine one or more of a position and a speed of the rotary solenoid or brushed DC motor based on the feedback.

23. The method of claim 21 wherein the load comprises one of a rotary solenoid or a brushed DC motor, and wherein a direction of rotation or actuation of the rotary solenoid or a brushed DC motor is controlled via the electrical polarity of the voltage applied thereto.

24. The method of claim 23 further comprising:

receiving feedback from the rotary solenoid or brushed DC motor; and determining one or more of a position and a speed of the rotary solenoid or brushed DC motor based on the feedback.

* * * * *